US011855641B2

(12) United States Patent
Shlomo

(10) Patent No.: US 11,855,641 B2
(45) Date of Patent: Dec. 26, 2023

(54) INTEGRATED RESISTOR NETWORK AND METHOD FOR FABRICATING THE SAME

(71) Applicant: Infineon Technologies LLC, San Jose, CA (US)

(72) Inventor: Oren Shlomo, Haifa (IL)

(73) Assignee: Infineon Technologies LLC, San Jose, CA (US)

( * ) Notice: Subject to any disclaimer, the term of this patent is extended or adjusted under 35 U.S.C. 154(b) by 392 days.

(21) Appl. No.: 17/113,501

(22) Filed: Dec. 7, 2020

(65) Prior Publication Data

US 2022/0011801 A1    Jan. 13, 2022

Related U.S. Application Data

(60) Provisional application No. 63/048,975, filed on Jul. 7, 2020.

(51) Int. Cl.
*G01K 7/18*   (2006.01)
*H03K 5/1252*   (2006.01)
(Continued)

(52) U.S. Cl.
CPC ........... *H03K 5/1252* (2013.01); *G01K 7/183* (2013.01); *G01K 7/20* (2013.01); *G01R 19/2506* (2013.01);
(Continued)

(58) Field of Classification Search
CPC ............ G01K 7/18; G01K 7/183; G01K 7/20; G01K 7/203; G01K 7/24; G01K 7/30; G01R 19/2506; G01R 19/165; G01R 19/16504; G01R 19/16509; G01R 19/16514; G01R 19/16519; G01R 19/16523; G01R 19/16528; G01R 19/16533; G01R 19/16538;
(Continued)

(56) References Cited

U.S. PATENT DOCUMENTS 3,890,610 A * 6/1975 Cahen ................. H01L 27/0802
257/E27.047
4,539,553 A * 9/1985 Takeda .................... H03M 1/74
341/126

(Continued)

FOREIGN PATENT DOCUMENTS

EP    1814233 A1 *    8/2007    .......... H03M 1/1019

*Primary Examiner* — Thienvu V Tran
*Assistant Examiner* — Nusrat Quddus

(57) ABSTRACT

A resistor network with reduced area and/or improved voltage resolution and methods of designing and operating the same are provided. Generally, the resistor network includes a resistor ladder with a first number (n) of integrated resistors coupled in series between a top and a bottom contact, with one or more contacts coupled between adjacent resistors. A second number of integrated resistors is coupled in parallel between the top and bottom contacts, and a third number of integrated resistors is coupled in series between the second integrated resistors and either the top or the bottom contact. Each of the integrated resistors has a resistance of R, and a voltage developed across each resistor in the resistor ladder is equal to a voltage applied between the top and bottom contacts divided by n. Where the second number is n−1, and the third number is 1, the total number of resistors is 2n.

11 Claims, 9 Drawing Sheets

(51) Int. Cl.
| | |
|---|---|
| *H03K 5/153* | (2006.01) |
| *H03K 5/19* | (2006.01) |
| *G11C 7/20* | (2006.01) |
| *H03K 17/24* | (2006.01) |
| *G11C 7/02* | (2006.01) |
| *H03K 17/22* | (2006.01) |
| *G01K 7/20* | (2006.01) |
| *G05F 1/648* | (2006.01) |
| *G01R 19/25* | (2006.01) |
| *G11C 7/10* | (2006.01) |
| *G11C 7/14* | (2006.01) |
| *H03K 5/24* | (2006.01) |

(52) U.S. Cl.
CPC ............... *G05F 1/648* (2013.01); *G11C 7/02* (2013.01); *G11C 7/1039* (2013.01); *G11C 7/14* (2013.01); *G11C 7/20* (2013.01); *H03K 5/153* (2013.01); *H03K 5/19* (2013.01); *H03K 5/2472* (2013.01); *H03K 17/223* (2013.01); *H03K 17/24* (2013.01)

(58) Field of Classification Search
CPC ........ G01R 19/16542; G01R 19/16547; G01R 19/16552; G01R 19/16557; G01R 19/16561; G01R 19/16566; G01R 19/16571; G01R 19/16576; G01R 19/1658; G01R 19/16585; G01R 19/1659; G01R 19/16595; G01R 19/17; G05F 1/648; G05F 1/644; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/463; G05F 1/468; G05F 1/46; G05F 1/461; G05F 1/575; G05F 1/465; G11C 7/02; G11C 7/1039; G11C 7/14; G11C 7/20; H03K 5/153; H03K 5/19; H03K 5/2472; H03K 17/223; H03K 17/24
See application file for complete search history.

(56) References Cited

U.S. PATENT DOCUMENTS

| | | | | |
|---|---|---|---|---|
| 4,827,222 A * | 5/1989 | Hester | ............... | H01C 17/23 330/261 |
| 5,969,658 A * | 10/1999 | Naylor | ............... | H03M 1/68 341/145 |
| 6,222,473 B1 * | 4/2001 | Castaneda | ............... | H03M 1/06 341/154 |
| 6,331,768 B1 * | 12/2001 | Drori | ............... | H03H 7/24 323/298 |
| 7,250,890 B1 * | 7/2007 | Wong | ............... | H03M 1/0607 341/154 |
| 7,619,402 B1 * | 11/2009 | Kwong | ............... | G05F 1/575 323/369 |
| 8,581,766 B1 * | 11/2013 | Li | ............... | H03M 1/785 341/145 |
| 8,618,971 B1 * | 12/2013 | Li | ............... | H03M 1/68 341/145 |
| 9,214,950 B1 * | 12/2015 | Davis | ............... | H03M 1/0621 |
| 10,305,505 B1 * | 5/2019 | Zhang | ............... | H03M 1/68 |
| 10,312,931 B2 * | 6/2019 | Zhang | ............... | H03F 3/45475 |
| 10,374,622 B2 * | 8/2019 | Zhang | ............... | H03M 1/765 |
| 10,505,530 B2 * | 12/2019 | Ranta | ............... | H03K 17/6874 |
| 11,271,576 B1 * | 3/2022 | Weil | ............... | H03M 1/1009 |
| 2002/0145552 A1 * | 10/2002 | Gorman | ............... | H03M 1/682 341/145 |
| 2004/0232977 A1 * | 11/2004 | Lee | ............... | H03H 11/0466 327/552 |
| 2005/0024251 A1 * | 2/2005 | Harada | ............... | H03M 1/1225 341/163 |
| 2006/0284680 A1 * | 12/2006 | da Fonte | ............... | H03F 1/34 330/254 |
| 2008/0303704 A1 * | 12/2008 | Ginosar | ............... | H03M 1/068 341/145 |
| 2009/0140903 A1 * | 6/2009 | Edwards | ............... | H03M 1/002 341/150 |
| 2011/0063009 A1 * | 3/2011 | Tseng | ............... | G05F 1/575 327/306 |
| 2012/0200442 A1 * | 8/2012 | Li | ............... | H03M 1/0692 341/154 |
| 2013/0200877 A1 * | 8/2013 | Nakatsuka | ............... | G09G 3/3696 323/313 |
| 2013/0215540 A1 * | 8/2013 | Wang | ............... | H02H 9/046 361/56 |
| 2013/0284811 A1 * | 10/2013 | Cok | ............... | G06K 19/07758 235/492 |
| 2015/0236691 A1 * | 8/2015 | Cam | ............... | H03K 17/6874 343/876 |
| 2016/0085256 A1 * | 3/2016 | Cam | ............... | G05F 3/247 327/382 |
| 2017/0201827 A1 * | 7/2017 | Kang | ............... | H04R 3/12 |
| 2018/0300618 A1 * | 10/2018 | Obradovic | ............... | G06N 3/04 |
| 2019/0305768 A1 * | 10/2019 | Willard | ............... | H01L 27/0727 |
| 2019/0379383 A1 * | 12/2019 | Strom | ............... | H03F 3/45475 |
| 2020/0075573 A1 * | 3/2020 | Harrell | ............... | H01L 23/5256 |
| 2020/0201375 A1 * | 6/2020 | Codega | ............... | G05F 3/30 |
| 2020/0203045 A1 * | 6/2020 | Tiedemann | ............... | H03M 1/78 |
| 2020/0259499 A1 * | 8/2020 | White | ............... | H03M 1/0626 |
| 2021/0250199 A1 * | 8/2021 | Evers | ............... | H04L 12/40169 |
| 2021/0344338 A1 * | 11/2021 | Willard | ............... | H03K 17/6872 |
| 2022/0206520 A1 * | 6/2022 | Jiang | ............... | G05F 1/56 |

* cited by examiner

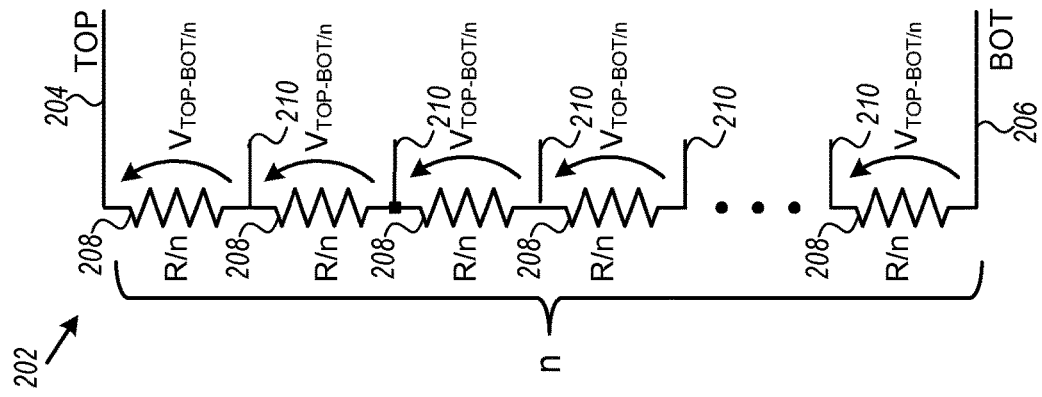
FIG. 2
(Conventional)
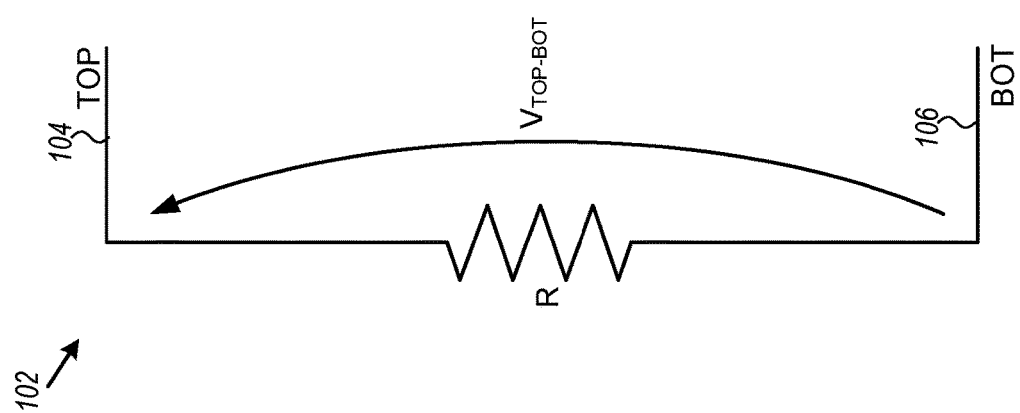
FIG. 1
(Conventional)

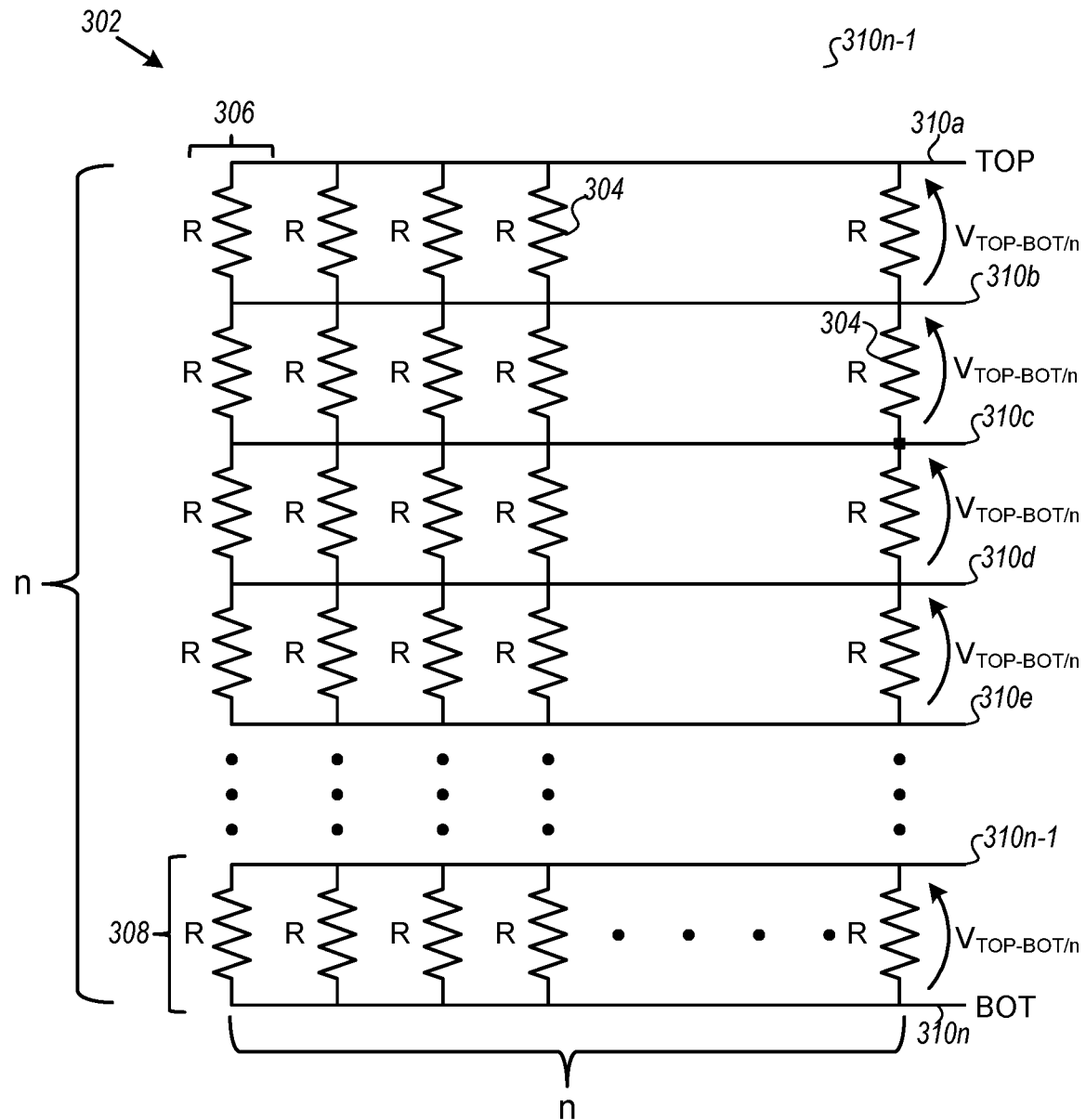
FIG. 3
(Conventional)

INTEGRATED RESISTOR NETWORK AND METHOD FOR FABRICATING THE SAME

CROSS-REFERENCE TO RELATED APPLICATIONS

This application claims the benefit of priority under 35 U.S.C. 119(e) to U.S. Provisional Patent Application Ser. No. 63/048,975, filed Jul. 7, 2020, which is incorporated by reference herein in its entirety.

TECHNICAL FIELD

This disclosure relates generally resistor networks, and more particularly to resistor networks integrally formed in an integrated circuit (IC), and having a reduced area and/or improved voltage resolution when used as a voltage divider in an IC, and methods of designing, fabricating and using the same.

BACKGROUND

Integral resistor networks can include multiple independent, integral resistors formed on a semiconductor substrate or chip along with other elements of an integrated circuit (IC), and are used, for example, as a voltage divider used in a wide range of applications including in voltage regulation loops and temperature detector systems.

Integrated resistors are typically made using a bulk or sheet resistivity of a semiconductor material formed on or in a surface of the substrate, and is commonly fabricated by depositing and patterning a thin film or an epitaxial layer of a conducting or semiconducting material, or by diffusing a dopant into the surface of the substrate. Generally, for a single integrated resistor, the resistance (R) in ohms is expressed by:

$$R = R_s \, l/w$$

where Rs is the sheet or bulk resistance of the patterned layer or diffusion region in ohms/square, l is a length and w is a width of conduction path through the resistor. It is important to note that two resistors having same width vs. length (W/L) ratio but not having same exact width (W) and length (L), will not have a matched resistance. Thus, in changing and more importantly in matching resistance between resistors it is generally desirable to change a number or multiplicity of matched resistors and not merely physical dimensions of the resistor.

FIG. 1 is a schematic representation of a single monolithic integrated resistor 102 having a resistance R between a top contact 104 and a bottom contact 106. FIG. 2 is a schematic representation of an n by R/n resistor ladder 202 having a total resistance between a top contact 204 and a bottom contact 206 of R, and including a number (n) of individual integrated resistors 208 each with a resistance of R/n and with contacts 210 there between to form a voltage divider. For example, for a voltage divider formed by placing 1V across the resistor ladder, where the resistor ladder includes ten (n=10) individual integrated resistors, and eleven contacts, the voltage divider can provide voltages of from 100 millivolt (mV) to 1V in 100 mV increments, provided the resistance of each individual integrated resistor is equal, and any resistance of the contacts is equal or negligible. However, in practice resistance of individual integrated resistors and contacts are often not equal due to variations in the fabrication processes, and the resistance of the contacts is not negligible for small resistors or for resistors with low sheet-resistance, which often have a resistance only one or two order of magnitudes higher than the contact resistance.

More significantly, as is generally known in design practice, the resistances of individual integrated resistors do not scale due to variations in physical dimensions, and in particular differences in a length or width of a scaled resistor—even where a ratio of the width versus length of the conduction path through the resistor are the same. That is for an individual integrated resistor having dimensions $\frac{1}{10}^{th}$ the size of a single, monolithic integrated resistor 102, i.e., $\frac{1}{10}^{th}$ the length or 10-times a width of the monolithic integrated resistor, or some combination of length or width that would mathematically result in a resistance a tenth ($\frac{1}{10}^{th}$) of the resistance of the single, larger resistor, does not in practice yield a resistance $\frac{1}{10}^{th}$ that of the monolithic integrated resistor 102.

A conventional approach to increasing voltage resolution of an integrated resistor network while avoiding the scaling problem is shown schematically in FIG. 3. Referring to FIG. 3 the resistor network 302 includes a number of individual, integrated resistors 304 arranged in an n×n or $n^2$ arrangement or array of n columns 306 of n resistors in series, and n rows 308 of resistors in parallel to provide a total resistance of R for the $n^2$ array from a top contact 310a and a bottom contact 310n of a number of contacts 310a-n and a resistance for each row of R/n. Thus, the voltage across each row is equal to $V_{TOT-BOT}/n$, where $V_{TOP-BOT}$ is the voltage developed across the full resistor network 302 from the top contact 310a to the bottom contact 310b, and n is the number of rows. Although this approach solves the scaling problems, it increases a surface area or footprint for the resistor network 302 on the substrate by a factor of $n^2$. Moreover, the total parasitic capacitance of each resistor to the substrate or between each resistor and contacts 310a-n, by a factor of about $n^2$ times larger than for a single resistor, which can adversely impact performance of the resistor network 302 and/or the IC in which it is used.

Accordingly, there is a need for a resistor network including multiple individual integrated resistors to improve resolution in voltage division, having an architecture or arrangement that reduces the number of individual, integrated resistors, thereby minimizing the surface area or footprint and parasitic capacitance of the resistor network.

SUMMARY

A resistor network with reduced area and/or improved voltage resolution and methods of designing and operating the same are provided. Generally, the resistor network includes a resistor ladder with a first number (n) of first integrated resistors coupled in series between a top and a bottom contact, with one or more contacts coupled between adjacent resistors. A second number of second integrated resistor is coupled in parallel between the top and bottom contacts, and a third number of third integrated resistor is coupled in series between the second integrated resistors and either the top or the bottom contact. Where each of the integrated resistors has a resistance of R and dimensions substantially the same as resistors in a row or column of a conventional $n^2$ array they replace, a voltage developed across each of the first integrated resistors is $V_{TOP-BOT}/n$, where $V_{TOP-BOT}$ is a voltage applied between the top contact and the bottom contact.

The resistor network is particular useful in applications or systems implemented as an integrated circuit (IC) on a single IC chip, such as reference voltage generators, voltage regulation loops, resistance-based temperature detector systems, and any resistor-ladder-based voltage-division used as a part of an analog block.

In some embodiments, where the second number of second integrated resistors is n−1, and the third number of third integrated resistors is 1, the total number of resistors is 2n. Where each of the first, second and third integrated resistors occupy an area on a surface of an IC chip of A, a total area occupied by the first, second and third integrated resistors of the integrated resistor network is 2n×A. Thus, a voltage resolution of the voltage developed across each of the first integrated resistors is substantially equal to that developed across each integrated resistor of an $n^2$ integrated resistor network having a total of $n^2$ integrated resistors, and occupying an area on a surface of an IC chip of $n^2A$, where A is substantially equal to an area occupied by each of the integrated resistors, and is a result of maintaining the original values of W and L of a single resistor of the $n^2$ integrated resistor network.

In another aspect a method of operating an integrated resistor network having a reduced number resistors, and/or occupying a reduce substrate surface area is provided. Generally, the method begins with providing a voltage-generating-section of the resistor network coupled between a top contact and a bottom contact. The voltage-generating-section. Next, a resistance path is provided coupled between the top contact and the bottom contact in parallel with the voltage-generating-section. A voltage ($V_{top-bot}$) applied between the top contact and the bottom contact causes an electrical current to flow concurrently through the voltage-generating-section and through the resistance path, developing a voltage of $V_{top-bot}/n$ across each of the integrated resistors in the voltage-generating-section and providing an equivalent resistance of R with the help of the resistance path.

BRIEF DESCRIPTION OF DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIG. 1 (conventional) is a schematic representation of an integrated resistor having a resistance R;

FIG. 2 (conventional) is a schematic representation of a resistor ladder suitable for use in a voltage divider and including multiple integrated resistors and/or contacts to increase voltage resolution;

FIG. 3 (conventional) is a schematic representation of a resistor network including multiple integrated resistors in an n×n ($n^2$) arrangement to increase voltage resolution;

DETAILED DESCRIPTION

An integrated resistor network with reduced area and/or improved voltage resolution and methods of designing and operating the same are provided. The integrated resistor network and methods of operating the same are particularly useful in or with applications or systems implemented as an integrated circuit (IC) on a single IC chip, such as reference voltage generators, voltage regulation loops, resistance-based temperature detector systems, and any resistor-ladder-based voltage-division used as a part of an analog block.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

Figure 4A:
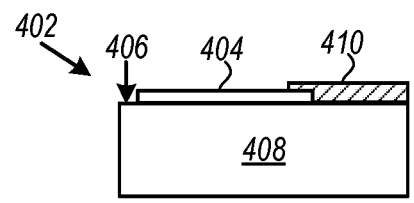
FIG. 4A is a cross-sectional view of a thin-film or epitaxial integrated resistor formed on a surface of a substrate and a contact thereto.
Figure 4B:
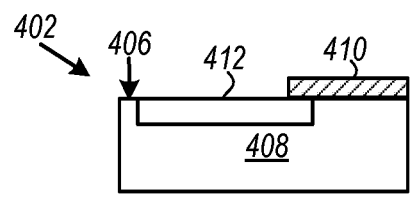
FIG. 4B is a cross-sectional view of another integrated resistor formed by diffusion into a surface of the substrate and a contact thereto.
Figure 4C:
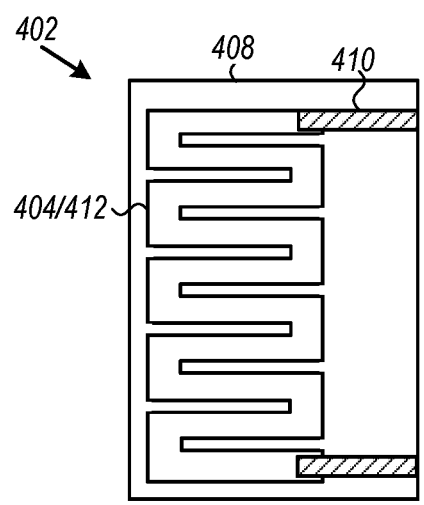
FIG. 4C is a planar top view of the integrated resistor of either FIG. 4A or 4B and contacts thereto.

Integrated resistors are typically made using a bulk or sheet resistivity of a semiconductor material formed on or in a surface of the substrate, and is commonly fabricated by depositing and patterning a thin film or an epitaxial layer of a conducting or semiconducting material, or by diffusing a dopant into the surface of the substrate. FIG. 4A is a cross-sectional view of an integrated resistor 402 formed from a thin-film or epitaxial layer 404 deposited on a surface 406 of a substrate 408 and a contact 410. FIG. 4B is a cross-sectional view of another embodiment of the integrated resistor formed by a diffusion region 412 into the surface 406 of the substrate 408 with the contact 410. FIG. 4C is a planar top view of the integrated resistor 402 of either FIG. 4A or 4B. The patterned layer 404 or diffusion region 412 can have a substantially linear or rectangular shape between the contacts 410, or can have a zig-zag shape resulting in larger effective length for higher values of resistance as shown in FIG. 4C.

Figure 5:
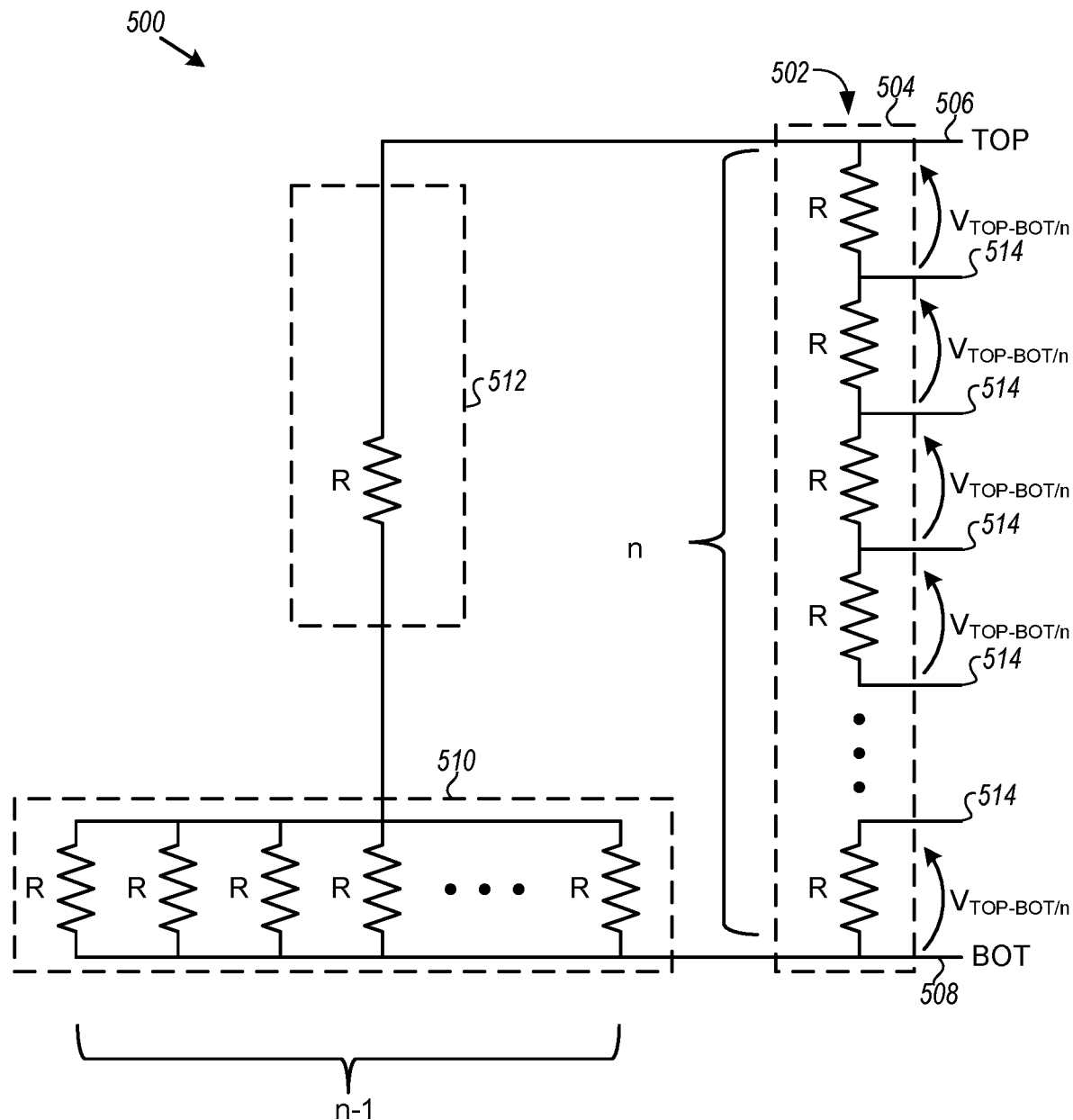
FIG. 5 is a schematic representation of a resistor network including multiple integrated resistors in a 2n arrangement to increase voltage resolution while reducing overhead area from that shown in FIG. 3.

FIG. 5 is a schematic representation of an integrated resistor network including multiple integrated resistors in a 2n arrangement on a surface of a substrate (not shown). Referring to FIG. 5 the resistor network 500 includes a first resistance path including a resistor ladder 502 having a first number (n) of first integrated resistors 504 coupled in series between a top contact 506 and a bottom contact 508, and a second resistance path including a second number of second integrated resistors 510 coupled in parallel between the top contact and the bottom contact and a third number of third integrated resistors 512 coupled in series between the second integrated resistors and one of the top contact or the bottom contact. Generally, as in the embodiment shown, the resistor network 500 further includes one or more contacts 514, coupled between adjacent individual of first integrated resistors 504 in the resistor ladder 502 to provide incremental voltages less than a voltage applied between the top contact and the bottom contact ($V_{TOP-BOT}$).

Each of the first, second and third integrated resistors 504, 510, 512, have similar or substantially equal widths and lengths, and are fabricated using processes and materials having substantially the same sheet resistance to provide resistors having substantially equal resistance of R, so that a voltage developed across each of the first integrated resistors 504 in the resistor ladder 502 is $V_{TOP-BOT}/n$. Additionally, for the 2n resistor network 500, such as shown in FIG. 5, in which the first number of first integrated resistors 504 is n, the second number of second integrated resistors 510 is n−1, and the third number of third integrated resistors 512 is 1, for a total number of the first, second and third integrated resistors of 2n, while the equivalent resistance ($R_{EQ-TOP-BOT}$) across the 2n resistor network from the top contact 506 to the bottom contact 508 is substantially equal to that of a resistor network 302 including multiple integrated resistors 304 each with equal resistances and arranged in an n×n ($n^2$) arrangement, such as shown in FIG. 3. This is because the resistance of all resistors in the $n^2$ resistor network 302 are equal, as are the number of rows 308 and columns 306 in the $n^2$ resistor network, the resistance for each row is R/n and the equivalent resistance ($R_{EQ-TOP-BOT}$) across the $n^2$ resistor network from the top contact 310a to the bottom contact 310n is n×R/n or R, where R is the resistance for each resistor 304, and n is the number of individual resistors in each row 308 and column 306.

For a 2n resistor network 500 such as shown in FIG. 5, the $R_{EQ-TOP-BOT}$ is equal to:

$$nR \| \left(R + \frac{R}{n-1}\right) =$$

$$\frac{nR(R + R/(n-1))}{nR + (R + R/(n-1))} = nR \frac{\left[\frac{(nR - R + R)}{(n-1)}\right]}{\frac{(Rn^2 - Rn + Rn - R + R)}{(n-1)}} = \frac{R^2 n^2}{Rn^2} = R$$

where R is the resistance of each of the first, second and third integrated resistors 504, 510, 512, and n is the first number of the first integrated resistors in the resistor ladder 502.

It will be understood from the above that voltage developed across each of the first integrated resistors in the resistor ladder 502 is $V_{TOP-BOT}/n$, is equivalent to the voltage developed across each row 308 of the $n^2$ resistor network 302. Thus, the 2n resistor network 500 provides the substantially same or equivalent voltage-resolution as the conventional $n^2$ resistor network 302 of FIG. 3 with a substantial reduction in the number of individual resistors required in the 2n resistor network 500 for any value of n≥3. For example, where n is 10, the $n^2$ resistor network 302 requires 100 separate, resistors 304, while the 2n resistor network 500 provides the same voltage-resolution with just 20 individual resistors, a reduction of 80%. Moreover, because the number of resistors in the $n^2$ resistor network 302 increases quadratically, the reduction in the number of resistors for a 2n resistor network 500 with the same voltage-resolution also increases quadratically. Thus, where n is 100 the $n^2$ resistor network 302 requires 10,000 separate, resistors 304, while the 2n resistor network 500 provides the same voltage-resolution with just 200 individual resistors, a reduction of 98%.

Additionally, because each of the first, second and third integrated resistors 504, 510, 512, have substantially equal widths and lengths and each occupy substantially the same area on a surface of a substrate on which they are fabricated, the 2n resistor network 500 provides a substantial reduction in the surface area or footprint on the substrate for the 2n resistor network as compared to the conventional $n^2$ resistor network 302 of FIG. 3 having substantially similarly size resistors providing the same voltage-resolution. This reduction in surface area will now be described with reference to exemplary embodiments shown in FIGS. 6 and 7.

Figure 6:
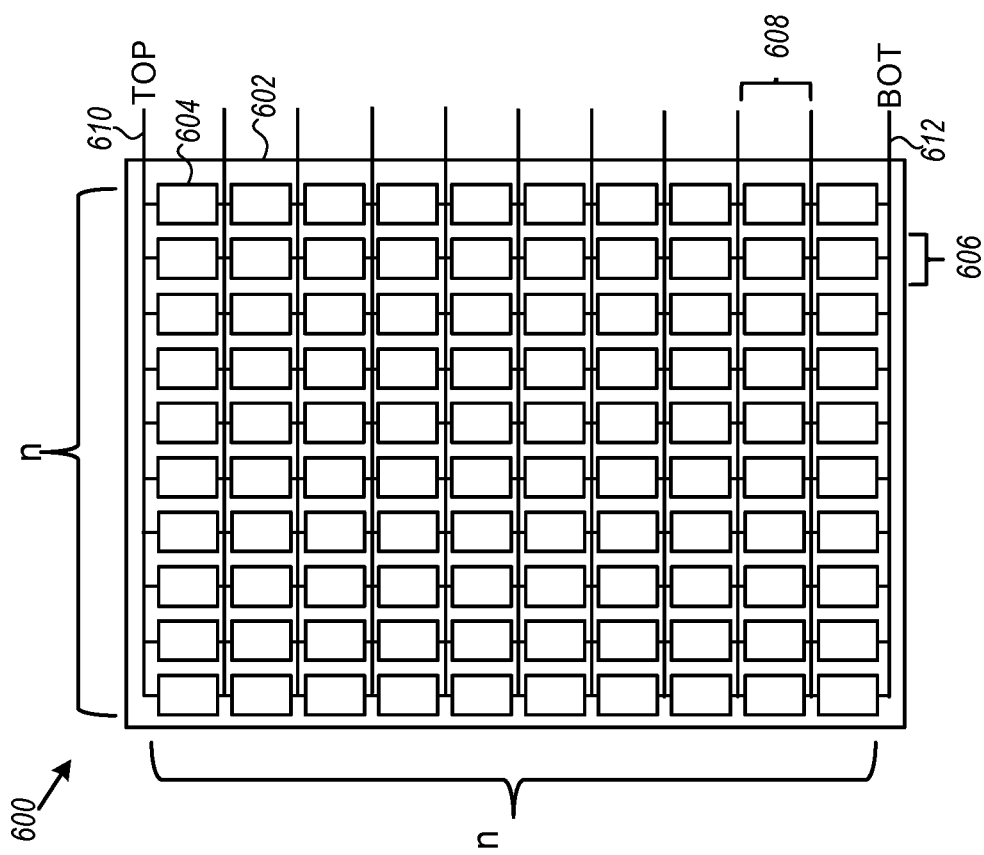
FIG. 6 (conventional) is a block diagram illustrating a surface area on a substrate of a $n^2$ resistor network.

FIG. 6 is a block diagram illustrating an exemplary embodiment of a surface area of a conventional $n^2$ resistor network 600 formed on a substrate 602, and including a number of integrated resistors 604 arranged in an n×n ($n^2$) arrangement of n columns 606 of n resistors in series, and n rows 608 of resistors in parallel to provide a total resistance of R for the resistor network from a top contact 610 to a bottom contact 612. Where, as in the embodiment shown, n is equal to ten the total number of individual, integrated resistors 604 is one hundred, and the surface of substrate 602 occupied by the integrated resistors is $n^2 \times A$ or 100×A, where A is an area occupied by a single integrated resistor.

Figure 7:
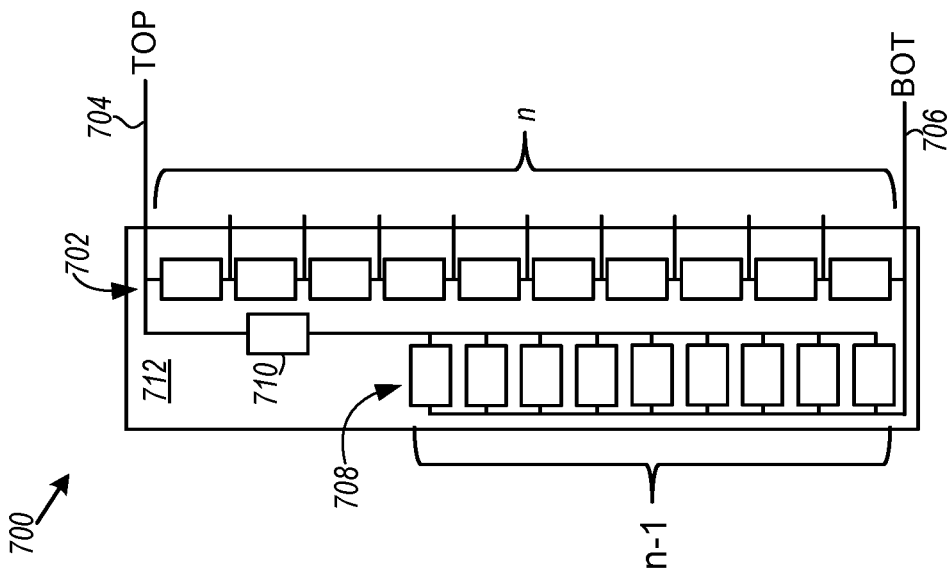
FIG. 7 is block diagram illustrating a surface area on a substrate of a 2n resistor network having the same voltage resolution as the $n^2$ resistor network of FIG. 6.

FIG. 7 is block diagram illustrating a surface area on a substrate of a 2n resistor network 700 including integrated resistors with the same resistance (R) and physical dimensions, i.e., each with the same length and width and occupying the same area (A), as the integrated resistors 604 of the $n^2$ resistor network of FIG. 6. As with the embodiment of the 2n resistor network 500 shown and described with respect to FIG. 5, the resistor network 700 includes a first number (n) of first integrated resistors 702 coupled in series between a top contact 704 and a bottom contact 706, a second number (n−1) of second integrated resistors 708 coupled in parallel between the top contact and the bottom contact, and a third integrated resistors 710 coupled in series between the second integrated resistors and the top contact. As noted previously, where n equal ten the 2n resistor network 700 requires only twenty individual resistors 702 to provide the same voltage resolution as the $n^2$ resistor network of FIG. 6. Thus, the surface area of a substrate 712 occupied by the integrated resistors 702, 708, 710, is 2 nA or 20 A, a reduction in surface area of eighty percent.

Moreover, because the number and thus the area occupied by integrated resistors 604 in the $n^2$ resistor network 600 increases quadratically, the reduction in the surface area occupied by the integrated resistors 702, 708, 710, for the 2n resistor network 700 with the same voltage-resolution also decreases quadratically. Thus, where n is 100 the integrated resistors of the $n^2$ resistor network 600 occupy an area of 10,000×A, the 2n resistor network 700 provides the same voltage-resolution while occupying an area of just 200×A, a reduction of 98%.

Alternatively, in another embodiment where an area on a substrate allocated for a resistor network is held constant, that is the same area required for an $n^2$ resistor network is used for a 2n resistor network, the number of resistors in the 2n resistor network can be increased to provide increased voltage-resolution. For example, for an $n^2$ resistor network where n is equal to 10 and occupying an area of 100×A, a 2n resistor network can be fabricated where n is equal to 50 and also occupying an area of 100×A, while increasing voltage resolution by a factor of five.

Figure 8:
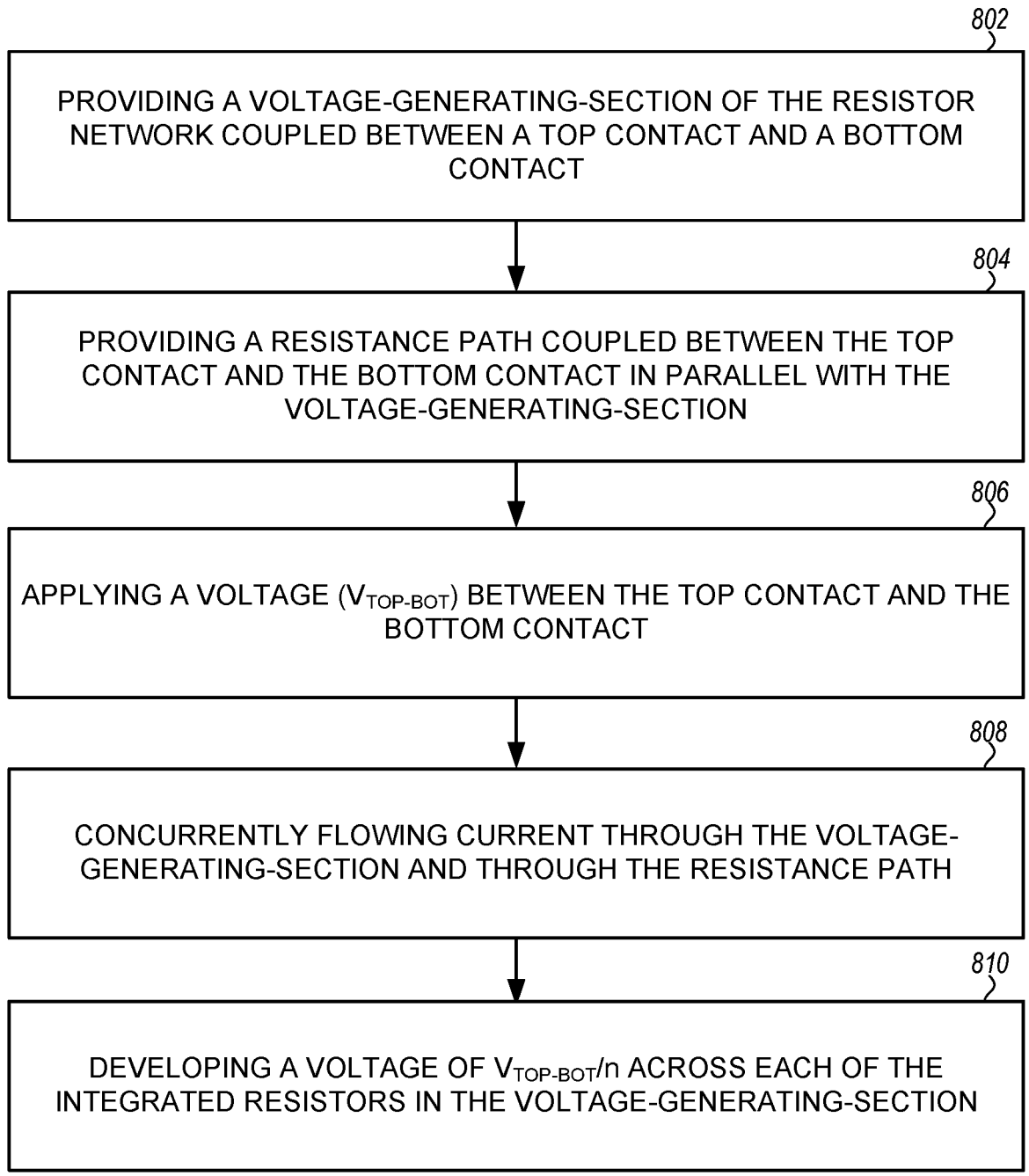
FIG. 8 is a flow chart of a method for increasing voltage resolution using the 2n resistor network of FIG. 5.

A method for operating a 2n resistor network to increase and/or maintain voltage resolution while reducing and/or maintaining the area or footprint of the resistor network on a surface of a substrate will now be described with reference to the flow chart of FIG. 8. Referring to FIG. 8, the method begins with the providing a voltage-generating-section of the resistor network coupled between a top contact and a bottom contact (step 802). Generally, as described above and shown with reference to FIG. 5, the voltage-generating-section includes a resistor ladder 502 with a first number of first integrated resistors connected in series between the top and bottom contacts 506, 508, with one or more additional contacts 514 coupled between adjacent series connected resistors. An additional resistance path is coupled between the top and bottom contacts in parallel with the voltage-generating-section (step 804). The current-path generally includes a second number of second integrated resistors 510 coupled in parallel, and a third number of third integrated resistors 512 coupled in series with the second number of second integrated resistors between the top and bottom contacts 506, 508. Next, a voltage ($V_{TOP-BOT}$) is applied between or across the top and bottom contacts (step 806), and an electrical current is caused to flow concurrently through the current-path and the voltage-generating-section (step 808). Finally, a voltage is developed across each of the first integrated resistors in the voltage-generating-section (resistor ladder 502) (step 810). As described above with reference to FIG. 5, the voltage developed across each of the first integrated resistors is $V_{TOP-BOT}/n$, where $V_{TOP-BOT}$ is a voltage applied between the top contact and the bottom contacts and n is the number of first integrated resistors in the voltage-generating-section coupled between the top and bottom contacts.

The integrated resistor network and methods of operating the same are particularly useful in or with applications or systems implemented as an integrated circuit on a single IC chip, such as reference voltage generators, voltage regulation loops, resistance-based temperature detector systems, and any resistor-ladder-based voltage-division used as a part of an analog block. A resistance-based temperature detector system including such a 2n resistor network will now be described with reference to the block diagram of FIG. 9.

Figure 9:
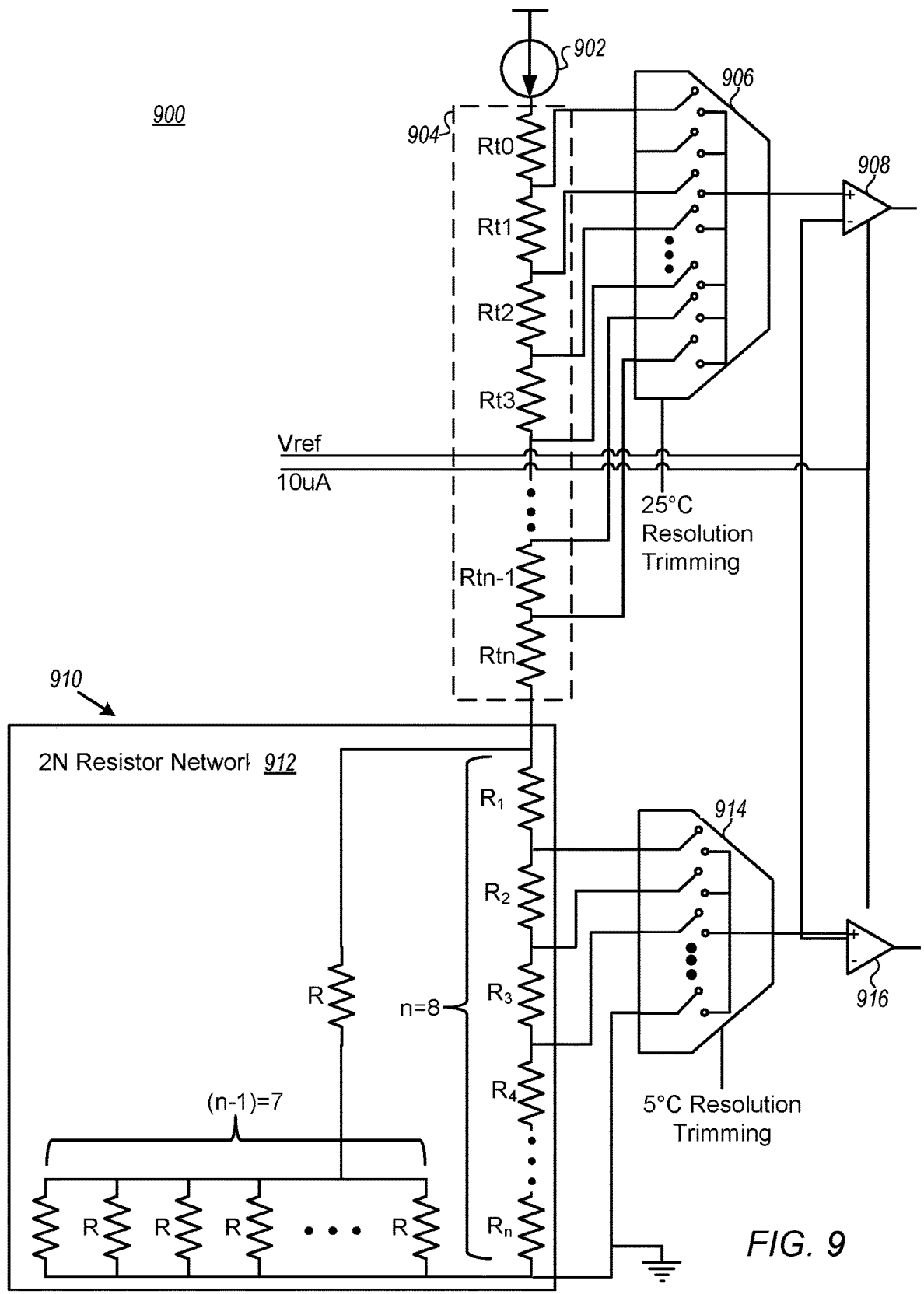
FIG. 9 is a block diagram of a temperature detector system including a 2n resistor network.

Referring to FIG. 9, the temperature detector system 900 includes a number of series connected resistors arranged in an architecture that resembles a voltage divider, but differs in that the resistances are not evenly distributed and instead of forcing a voltage a current is caused to flow through the series connected resistors. The current which is introduced into the series connected resistors from a current source 902 is a function of the temperature, and varies approximately linearly with changes in temperature. The temperature is measured by comparing a voltage at different nodes between the series connected resistors to a constant reference voltage (Vref). In the embodiment shown the series connected resistors include a first number of series connected resistors (Rt0–Rtn) in a high range voltage-generating resistor network 904 that is connected through a first multiplexer 906 to a first comparator 908, and a second number of series connected resistors in a low range voltage-generating resistor network 910, which includes a 2N resistor network 912, connected through a second multiplexer 914 to a second comparator 916. By high range it is meant that the high range voltage-generating resistor network 904 is capable of detecting and measuring temperature within larger or courser increments than the smaller or finer increments of the low range voltage-generating resistor network 910.

Generally:

$$I = A \times T,$$

where I is current, T is a temperature of the chip, and A is a derivative of the current and is positive (PTAT, so I is $I_{PTAT}$).

At a full temperature operation range a voltage ($V_{TOP}$) measured at a top node of the high range voltage-generating resistor network 904, will change from $V_{TOP\_LOW\_TEMP} = I_{PTAT\_LOW\_TEMP} \times R_{TOP-BOT}$ to $V_{TOP\_HIGH\_TEMP} = I_{PTAT\_HIGH\_TEMP} \times R_{TOP-BOT}$. Thus, the temperature can be detected and measured according to changes in $V_{TOP}$ value since $V_{TOP}$ voltage is $V_{TOP\ (temp)} = I_{PTAT\ (temp)} \times R_{TOP-BOT}$. Thus, by comparing a voltage between resistors (Rt0–Rtn) in the high range voltage-generating resistor network 904 and between resistors (R1–Rn) in the low range voltage-generating resistor network 910 to a constant reference voltage (Vref) the temperature can be detected.

The high range voltage-generating resistor network 904 and low range voltage-generating resistor network 910 are designed so when a certain temperature is crossed, the voltage generated from a specific node crosses Vref and is higher than Vref, the first or second comparator 908, 916 connected to Vref and to the high range voltage-generating resistor network or low range voltage-generating resistor network through the associated multiplexer 906 or 914 indicates that one or more voltages that comes from the specific node has crossed Vref. The temperature is then determined by noting the lowest node in the high range voltage-generating resistor network 904 and low range voltage-generating resistor network 910 at which the voltage compared is still higher than Vref. Generally, the high range voltage-generating resistor network 904 and low range voltage-generating resistor network 910 have a different number of series connected resistors, and therefore a different total resistance, but each use substantially equally sized resistors having a substantially equal resistance of R. That is a resistance of each of the resistors (Rtn through Rt0) shown in FIG. 9 are not necessarily equal but are generated from a similar basic resistance R. Thus, although each of the resistors is illustrated as having a resistance of R, the overall series resistance of the combined high range voltage-generating resistor network and low range voltage-generating resistor network has a resistance of Rn+1, where the high range voltage-generating resistor network has a resistance of R×m, where m can be any number real or integer and n is used for indexing purposes, and the low range voltage-generating resistor network has a resistance of R. In the embodiment shown in FIG. 9 the high range voltage-generating resistor network 904 has a temperature detection resolution of 25° C., which means that the voltage at a lower node of Rtn ($V_{RTn}$) will cross Vref at 25° C. higher temperature than the voltage ($V_{RTn-1}$) at which a higher node of Rtn-1 crossed the Vref. The low range voltage-generating resistor network 906, which includes the 2N resistor network, and has a total resistance of $RT_{n+1}$ and with a division ration of n=8 allows generating 8 and multiplexed voltages for a 5° C. resolution. As noted above, a temperature detector using a conventional $n^2$ resistor network would require an area for 64 R-sized resistors for a low range voltage-generating resistor network, while the low range voltage-generating resistor network 910 including the 2n resistor network can achieve an equivalent 5° C. resolution while occupying an area of just 16 R-sized resistors.

Alternative arrangements or configurations of resistor networks for reducing overhead area from that of a conventional $n^2$ network to a degree even greater than that achieved by the 2n resistor network of FIG. 5 will now be described with reference to FIGS. 10 and 11.

Briefly, through the addition of a third resistance path in parallel with the first and second resistance paths in the 2n resistor network of FIG. 5 the alternative resistor networks described below can gain a further area improvement over the 2n resistor network where n is an even number higher than or equal to 6. If the difference of n−2 results in an even natural number divisible by 4, a first alternative resistor network described below with reference to FIG. 10 will result in a total number of resistors of (1.25 n+3.5), as compared to a conventional $n^2$ network of equal resistance resolution, and an area of (1.25 n+3.5) times the area of a single resistor. If the difference of n−2 does not result in an even natural number divisible by 4, a second alternative resistor network described below with reference to FIG. 11 will result in a total number of resistors of (1.25n+5), as compared to a conventional $n^2$ network, and an area of (1.25 n+5) times the area of a single resistor.

A first alternative resistor network, where n is even natural number, greater than or equal to six (≥6), and where n−2 is divisible by 4, will now be described with reference to FIG. 10. All resistors R shown in FIG. 10 have substantially equivalent resistances and dimensions. This first alternative resistor network 1000 includes a first resistance path 1002 with a resistor ladder 1004 including a first group of n resistors. A second resistance path 1006 coupled in parallel with the first resistance path and including a second resistor 1008 coupled in series with a third resistor 1010; and in series with a fourth group of two or more resistors 1012 coupled in parallel. The number of parallel coupled resistors in the fourth group of resistors 1012 is equal to a quotient of (n−2)/4, which in the embodiment shown is two. As noted above, the first alternative resistor network 1000 further includes a third resistance path 1014 coupled in parallel with the first and second resistance paths 1002, 1006. The third resistance path 1014 includes a fifth resistor 1016 coupled in series with a sixth resistor 1018.

Figure 10:
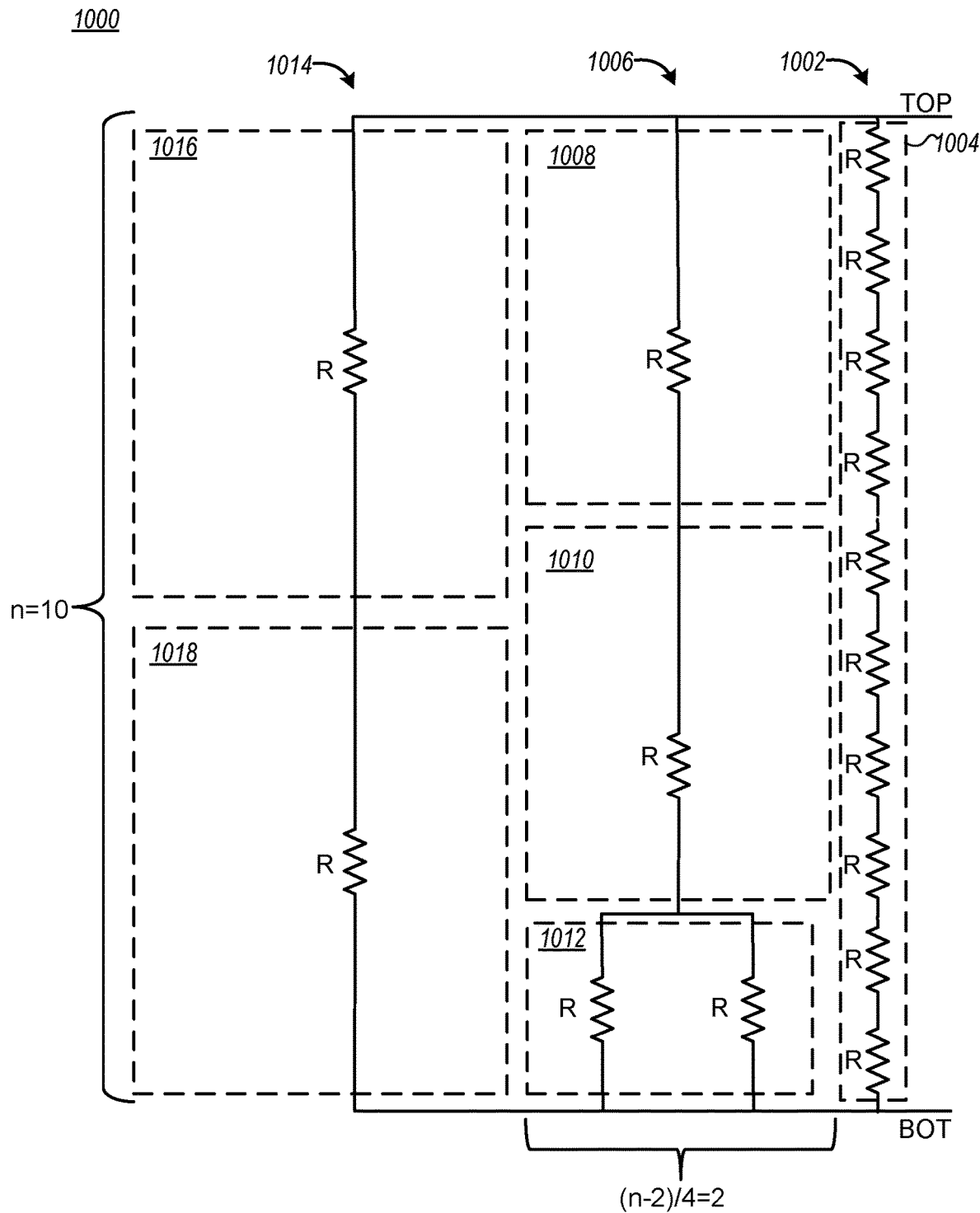
FIG. 10 is a schematic representation of a first alternative resistor network having a total of 1.25n+3.5 resistors, and further reducing overhead area from the 2n resistor network of FIG. 5.
Figure 11:
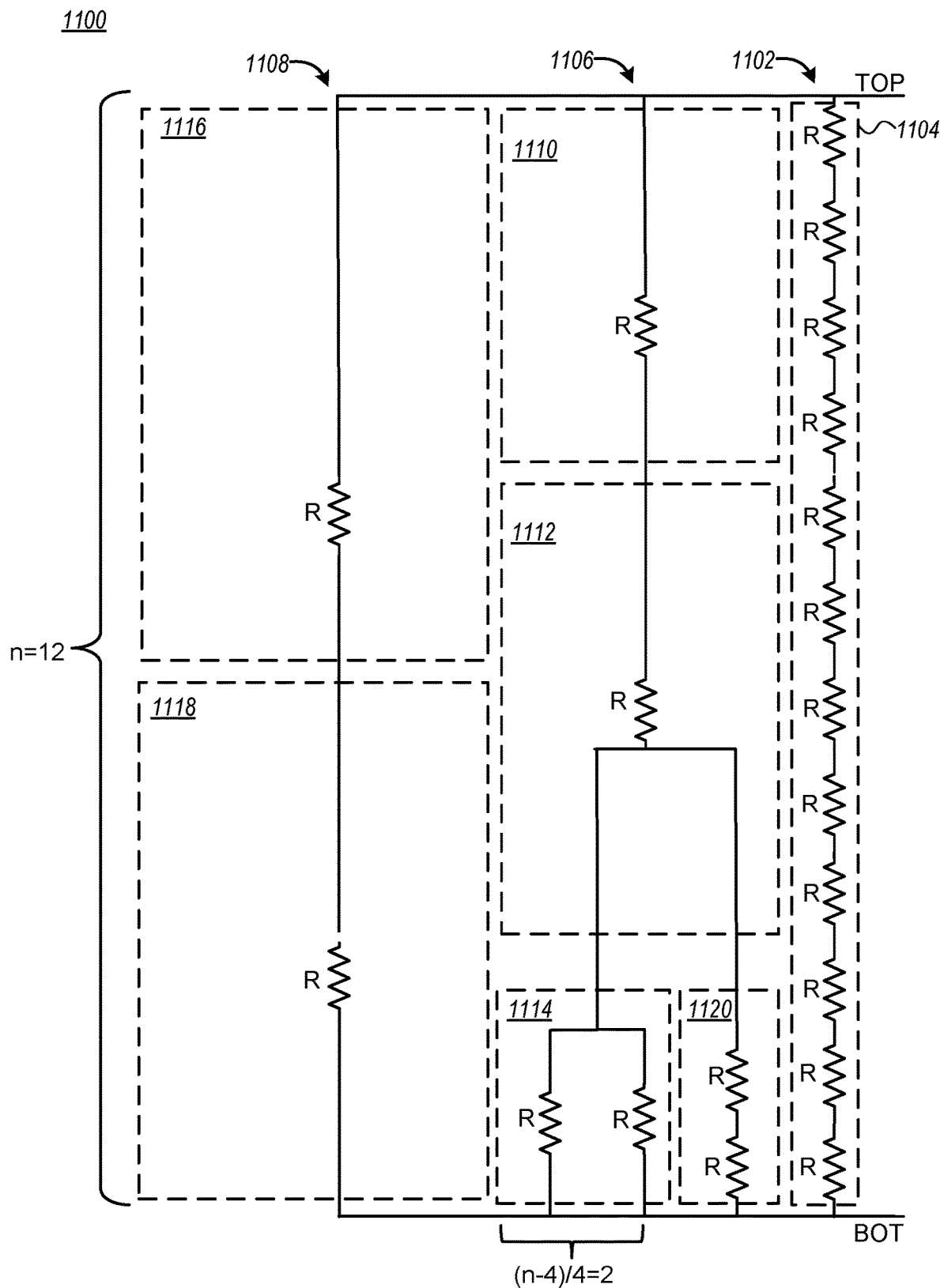
FIG. 11 is a schematic representation of another alternative resistor network having a total of 1.25n+5 resistors, and further reducing overhead area from the 2n resistor network of FIG. 5.

It is noted that in the first alternative resistor network 1000 shown in FIG. 10, the first group of resistors in the resistor ladder 1004 includes n or 10 resistors. The second and third groups of resistors 1008, 1010, each include 1 resistor and as compared to a conventional $n^2$ resistor network (such as shown in FIG. 3) having an equivalent resolution, i.e., a $10^2$ resistor network, each group replaces (n/2−1)×(n/2−1) resistors of the $n^2$ resistor network, or 16 resistors in the embodiment shown. Similarly, the fourth group of resistors 1012 includes 2 resistors, which replace (n−2)/4, or 8 resistors of the $n^2$ resistor network, and the fifth and sixth groups of resistors 1016, 1018, each include 1 resistor and replace (n/2)×(n/2), or 25 resistors of the $n^2$ resistor network. The total number of resistors in the first alternative resistor network 1000 can be calculated by summing the number of resistors in the first resistance path 1002 or n, the number of resistors in the second resistance path 1006 equal to 2+(n−2)/4, and the number of resistors in the third resistance path 1014. Thus, the total number of equally sized resistors in the first alternative resistor network 1000 is n+2+2+(n−2)/4=1¼n+1½+4=1.25 n+3.5, and the first alternative resistor network 1000 can be referred to as a (1.25n+3.5) resistor network. Where n=10 as shown in FIG. 10, the total number of equally sized resistors in the first alternative or (1.25n+3.5) resistor network 1000 is 16 and the area required for the network is 16RA, where RA is the area required for a single resistor. This represents a reduction in area of 84% over a conventional $n^2$ resistor network where n=10, and a 25% reduction in number of resistors and area over a 2n resistor network, which would require 20 resistors and have an area of 20RA. Where n=6 a (1.25n+3.5) resistor network similar to that shown in FIG. 10 would require 11 resistors, a 66% reduction in number of resistors and area over a conventional $n^2$ resistor network, and over an 8% reduction over a 2n resistor network. Where n=50 a (1.25n+3.5) resistor network similar to that shown in FIG. 10 would require 66 resistors, a 97% reduction in number of resistors and area over a conventional $n^2$ resistor network, and over an 34% reduction over a 2n resistor network.

A second alternative resistor network where n is even natural number, greater than or equal to eight (≥8), and where n−2 is not divisible by 4, will now be described with reference to FIG. 11. In the embodiment shown in FIG. 11 n=12, and all resistors R have substantially equivalent resistances and dimensions. This second alternative resistor network 1100, and includes a first resistance path 1102 with a resistor ladder 1104 including a first group of n resistors, a second resistance path 1106 coupled in parallel with the first resistance path, and a third resistance path 1108 coupled in parallel with the first and second resistance paths. As with the first alternative resistor network 1000 shown in FIG. 10 the second resistance path 1106 includes a second resistor 1110 coupled in series with a third resistor 1112; and in series with a fourth group of two or more resistors 1114 coupled in parallel. The third resistance path 1108 includes a fifth resistor 1116 coupled in series with a sixth resistor 1118. The second resistance path 1106 differs from that shown in FIG. 10 in that it further includes a seventh group 1120 of two series coupled resistors in parallel with the fourth group.

The total number of resistors in the second alternative resistor network 1100 can be calculated by summing the number of resistors in the first resistance path 1102 or n, the number of resistors in the second resistance path 1106 equal to 2+(n−4)/4+2, and the number of resistors in the third resistance path 1108. Thus, where n=12 as shown in FIG. 12 the total number of resistors in the second alternative resistor network 1100, is n+2+2+(n−4)/4+2=1¼n−1+6=1¼n+5, and the second alternative resistor network 1100 can be referred to as a (1.25n+5) resistor network. Where n=12 as shown in FIG. 11, the total number of equally sized resistors in the first alternative or (1.25n+5) resistor network 1100 is 20 and the area required for the network is 20RA, where RA is the area required for a single resistor. This represents a reduction in area of 86% over a conventional $n^2$ resistor network where n=12, and a 17% reduction in number of resistors and area over a 2n resistor network, which would require 24 resistors and have an area of 24RA. Where n=8 a (1.25n+5) resistor network similar to that shown in FIG. 11 would require 15 resistors, versus 64 for a conventional $n^2$ resistor network, and 16 for a 2n resistor network. Where n=52 a (1.25n+5) resistor network similar to that shown in FIG. 11 would require 70 resistors, versus 2704 for a conventional $n^2$ resistor network, and 104 for a 2n resistor network. In embodiments, alternative resistor networks 1000 and 1100 may be incorporated in the low range voltage-generating resistor network 910 as best shown in FIG. 5.

Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. An integrated resistor network comprising:
   a resistor ladder including a first number (n) of first integrated resistors coupled in series between a top contact and a bottom contact, with one or more contacts coupled between two adjacent first integrated resistors, wherein n is a natural positive number greater than 2;
   a second number of second integrated resistors coupled in parallel with one another, and each having a first terminal directly connected to the bottom contact, wherein the second number is n−1; and
   a third integrated resistor connected in series between second terminals of the second integrated resistors and the top contact,
   wherein each of the first, second and third integrated resistors have substantially equal width, length, and a resistance of R, and where a voltage developed across each of the first integrated resistors is $V_{TOP-BOT}/n$, and wherein $V_{TOP-BOT}$ is a voltage applied between the top contact and the bottom contact.

2. The integrated resistor network of claim 1, wherein an area on a surface of an integrated circuit (IC) chip occupied by the first, second and third integrated resistors is $2n \times A$, where A is an area of a one of the first, second or third integrated resistors.

3. The integrated resistor network of claim 2, wherein a voltage resolution of the voltage developed across each of the first integrated resistors is substantially equal to that developed across each integrated resistor of an $n^2$ integrated resistor network comprising a total of $n^2$ integrated resistors.

4. The integrated resistor network of claim 3, wherein a total capacitance of the integrated resistor network is reduced to a factor of $2n/n^2$ relative to that of the $n^2$ integrated resistor network.

5. A temperature detecting system comprising:
   a current source coupled in series with a low range voltage-generating resistor network comprising:
      a voltage-generating-section including a resistor ladder having a first number (n) of first integrated resistors coupled in series between a top contact and a bottom contact, with one or more contacts coupled between adjacent individual integrated resistor, wherein n is a natural positive number greater than 2; and
      a current-path coupled in parallel with the voltage-generating-section, the current-path including n−1 second integrated resistors coupled in parallel with one another, each having a first terminal directly connected to the bottom contact, and a single third integrated resistor connected in series between second terminals of the second number of second integrated resistors and the top contact,
      wherein each of the first, second and third integrated resistors have substantially equal resistances, and a voltage developed across each of the first integrated resistors in the voltage-generating-section is $V_{TOP-BOT}/n$, where $V_{TOP-BOT}$ is a voltage applied between the top contact and the bottom contact.

6. The system of claim 5, further comprising a high range voltage-generating resistor network coupled in series between the current source and the low range voltage-generating resistor network, wherein the low range voltage-generating resistor network can detect temperature with a greater resolution than the high range voltage-generating resistor network.

7. The system of claim 5, wherein an area on a surface of an integrated circuit (IC) chip occupied by the integrated resistors is $2n \times A$, where A is an area of a one of the integrated resistors.

8. The system of claim 7, wherein a voltage resolution of the voltage developed across each of the integrated resistors the resistor ladder is substantially equal to that developed across each integrated resistor of an $n^2$ integrated resistor network comprising a total of $n^2$ integrated resistors.

9. The system of claim 8, wherein a total capacitance of the integrated resistor network is reduced to a factor of $2n/n^2$ relative to that of the $n^2$ integrated resistor network.

10. An integrated resistor network comprising:
    a resistor ladder including a first number (n) of first integrated resistors coupled in series between a top contact and a bottom contact, with one or more contacts coupled between two adjacent first integrated resistors, wherein n is a natural positive number greater than 2; and
    a current-path coupled in parallel with the resistor ladder, the current-path consisting of n−1 second integrated resistors coupled in parallel, and a single third integrated resistor coupled in series with the second number of second integrated resistors between the top contact and the bottom contact,
    wherein each of the first, second and third integrated resistors have substantially equal width, length, and a resistance of R, and
    wherein a voltage resolution of the voltage developed across each of the first integrated resistors is substantially equal to that developed across each integrated resistor of an $n^2$ integrated resistor network comprising a total of $n^2$ integrated resistors, and wherein a total capacitance of the integrated resistor network is reduced to a factor of $2n/n^2$ relative to that of the $n^2$ integrated resistor network.

11. The integrated resistor network of claim 10, wherein an area on a surface of an integrated circuit (IC) chip occupied by the first, second and third integrated resistors is $2n \times A$, where A is an area of a one of the first, second or third integrated resistors.

* * * * *